(12) United States Patent
Choi (10) Patent No.: US 7,599,245 B2
(45) Date of Patent: Oct. 6, 2009

(54) OUTPUT CONTROLLER CAPABLE OF GENERATING ONLY NECESSARY CONTROL SIGNALS BASED ON AN ACTIVATED SELECTION SIGNAL

(75) Inventor: Hoon Choi, Kyoungki-do (KR)

(73) Assignee: Hynix Semiconductor, Inc., Gyeonggi-do (KR)

(*) Notice: Subject to any disclaimer, the term of this patent is extended or adjusted under 35 U.S.C. 154(b) by 0 days.

(21) Appl. No.: 12/252,775

(22) Filed: Oct. 16, 2008

(65) Prior Publication Data

US 2009/0040844 A1 Feb. 12, 2009

Related U.S. Application Data

(62) Division of application No. 11/476,573, filed on Jun. 29, 2006, now Pat. No. 7,447,108.

(30) Foreign Application Priority Data

Sep. 29, 2005 (KR) ............... 10-2005-0091570
Dec. 27, 2005 (KR) ............... 10-2005-0130483

(51) Int. Cl.
*G11C 8/18* (2006.01)

(52) U.S. Cl. ............... 365/233.12; 365/233.17; 365/233.13; 365/193; 365/194; 327/152; 327/153; 327/161

(58) Field of Classification Search ............ 365/233.17, 365/233.13, 233.12, 233.11, 233.1, 194, 365/193, 191; 327/152, 153, 141, 161
See application file for complete search history.

(56) References Cited

U.S. PATENT DOCUMENTS

| 6,525,988 | B2 | 2/2003 | Ryu et al. |
| 6,836,437 | B2 | 12/2004 | Li et al. |
| 6,930,949 | B2 | 8/2005 | Schaefer |
| 7,277,333 | B2 | 10/2007 | Schaefer |
| 7,447,108 | B2 * | 11/2008 | Choi ............... 365/233.12 |
| 2005/0060487 | A1 | 3/2005 | Barth et al. |
| 2005/0093599 | A1 | 5/2005 | Kwak |
| 2005/0262373 | A1 | 11/2005 | Kim |
| 2007/0019481 | A1 | 1/2007 | Park |
| 2007/0070790 | A1 | 3/2007 | Choi |

FOREIGN PATENT DOCUMENTS

| JP | 2004-047066 | 12/2004 |
| KR | 10-2005-0035637 | 4/2005 |
| KR | 10-2005-0041612 A | 5/2005 |
| KR | 2005-0105557 | 11/2005 |

OTHER PUBLICATIONS

Korean Office Action, with English Translation, issued in corresponding Korean Patent Application No. 2005-0130483, dated on Jul. 25, 2007.

* cited by examiner

*Primary Examiner*—Andrew Q Tran
(74) *Attorney, Agent, or Firm*—Mannava & Kang, P.C.

(57) ABSTRACT

An output controller includes: an output enable signal generator for generating corresponding ones among a plurality of output enable signals based on a preset column address strobe (CAS) latency, each of the output enable signals having information relating to a delay time from an activation timing of a CAS signal; and an output driving signal generator for receiving the plurality of output enable signals corresponding to the preset CAS latency and outputting rising and falling output driving signals for controlling an output timing of data.

4 Claims, 7 Drawing Sheets

OUTPUT CONTROLLER CAPABLE OF GENERATING ONLY NECESSARY CONTROL SIGNALS BASED ON AN ACTIVATED SELECTION SIGNAL

RELATED APPLICATIONS

This application is a Divisional of U.S. application Ser. No. 11/476,573, filed Jun. 29, 2006, now U.S. Pat. No. 7,447,108 claiming priority of Korean Application No. KR 10-2005-0091570, filed Sep. 29, 2005 and Korean Application No. KR 10-2005-0130483, filed Dec. 27, 2005, the entire contents of each of which are hereby incorporated by reference.

FIELD OF THE INVENTION

The present invention relates to a semiconductor memory device, and more particularly to an output controller for controlling a data output of a semiconductor memory device.

DESCRIPTION OF RELATED ARTS

As semiconductor memory devices are highly integrated, many attempts have been made to increase their operating speed. To achieve this purpose, synchronous memory devices which operate in synchronization with an external clock have been introduced.

A single data rate (SDR) synchronous memory device inputs and outputs one data bit via one data pin in synchronization with a rising edge of the external clock during one clock cycle.

However, the SDR synchronous memory device is insufficient to satisfy the speed requirement of a high-speed system. Thus, a double data rate (DDR) synchronous memory device which processes two data bits during one clock cycle has been proposed.

In the DDR synchronous memory device, two data bits are consecutively input and output through data input/output pins in synchronization with rising and falling edges of the external clock. The DDR synchronous memory device can implement at least two times the bandwidth of the SDR synchronous memory device without increasing the frequency of the clock, thus obtaining the high-speed operation.

Because the DDR memory device has to receive or output two data bits during one clock cycle, a data access method employed in the conventional synchronous memory device can no longer be used.

If the clock cycle is about 10 ns, two consecutive data bits must be substantially processed within about 6 nsec or less, except for the rising time and the falling time (about 0.5×4=2 ns) and time necessary for meeting other specifications. However, it is difficult to perform the process within the memory device. Therefore, the memory device operates in synchronization with the rising and falling edges of the clock only when inputting/outputting data from/to an external circuit. Substantially, the two data bits are processed in synchronization with one edge of the clock within the memory device.

In order to transfer data from a memory device to an internal core region or to output the transferred data to an external circuit, a new data access method is required.

The synchronous memory device uses several concepts different from those of the asynchronous memory device. One of them is a CAS latency (CL). The CAS latency is the number of clocks that are counted from an input of a read command to data output. If CL=3, it means that data are output to an external circuit after three clock cycles from an input of the read command. The CAS latency determines data output timing. In an initial operation of the semiconductor memory device, a detected set CL value is used to access and output data.

Therefore, a data output enable signal is generated after an operating clock cycle is delayed as much as the set CAS latency. Also, when the data output enable signal is activated, the accessed data is output in response to the read command.

The operating clock used is a delayed lock loop (DLL) clock obtained by delay locking an external clock by a predetermined time. This DLL clock is generated from a delay locked loop (DLL) circuit. In the synchronous semiconductor memory device, the data output has to be accurately synchronized with the rising and falling edges of the external clock. However, due to the delay time of the clock signal, which inevitably occurs during the internal processing, the data output cannot be accurately synchronized with the rising and falling edges of the external clock.

Figure 1:
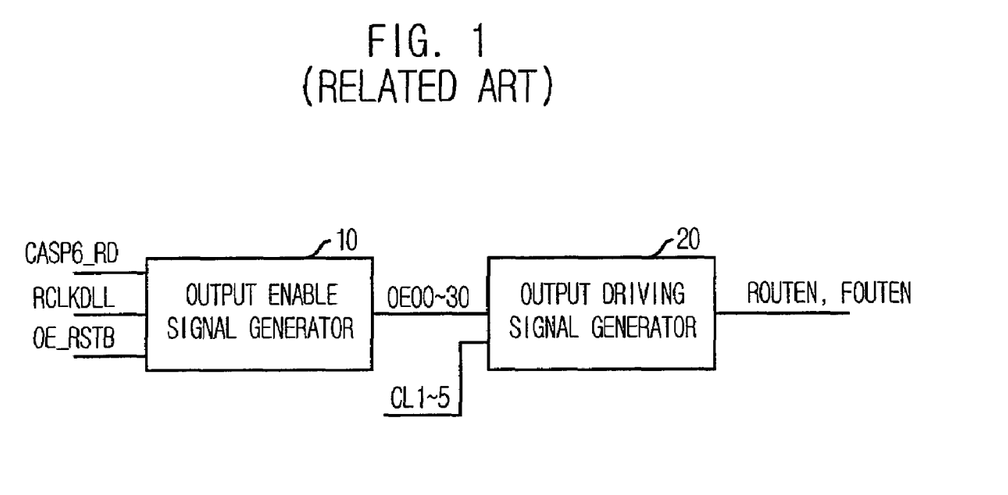
FIG. 1 is a block diagram of a conventional data output unit for outputting data corresponding to a read command in a DDR SDRAM.

FIG. 1 is a block diagram of a conventional data output unit for outputting data corresponding to a read command in a DDR synchronization memory device.

The conventional data output unit includes an output enable signal generator 10 and an output driving signal generator 20. The output enable signal generator 10 generates a plurality of output enable signals OE00 to OE30 having information relating to a delay time from an activation timing of a read column address strobe (CAS) signal CASP6_RD. The output driving signal generator 20 receives the plurality of output enable signals OE00 to OE30 and generates rising and falling output driving signals ROUTEN and FOUTEN in response to CAS latency information signals CL1 to CL5.

For reference, the read CAS signal CASP6_RD is produced by a read operation within the semiconductor memory device, and only the CAS latency information signals CL1 to CL5 corresponding to the CAS latency are activated.

Although not shown in FIG. 1, the rising and falling output driving signals ROUTEN and FOUTEN control timing when data output from a memory core block in response to the read command is output through a data pad. In order that the data output through the data pad satisfies the CAS latency, the rising and falling output driving signals ROUTEN and FOUTEN should be generated in consideration of the CAS latency. Accordingly, when the rising and falling output driving signals ROUTEN and FOUTEN are generated, the plurality of output enable signals OE00 to OE30 are generated in order to provide information relating to the CAS latency.

Figure 2:
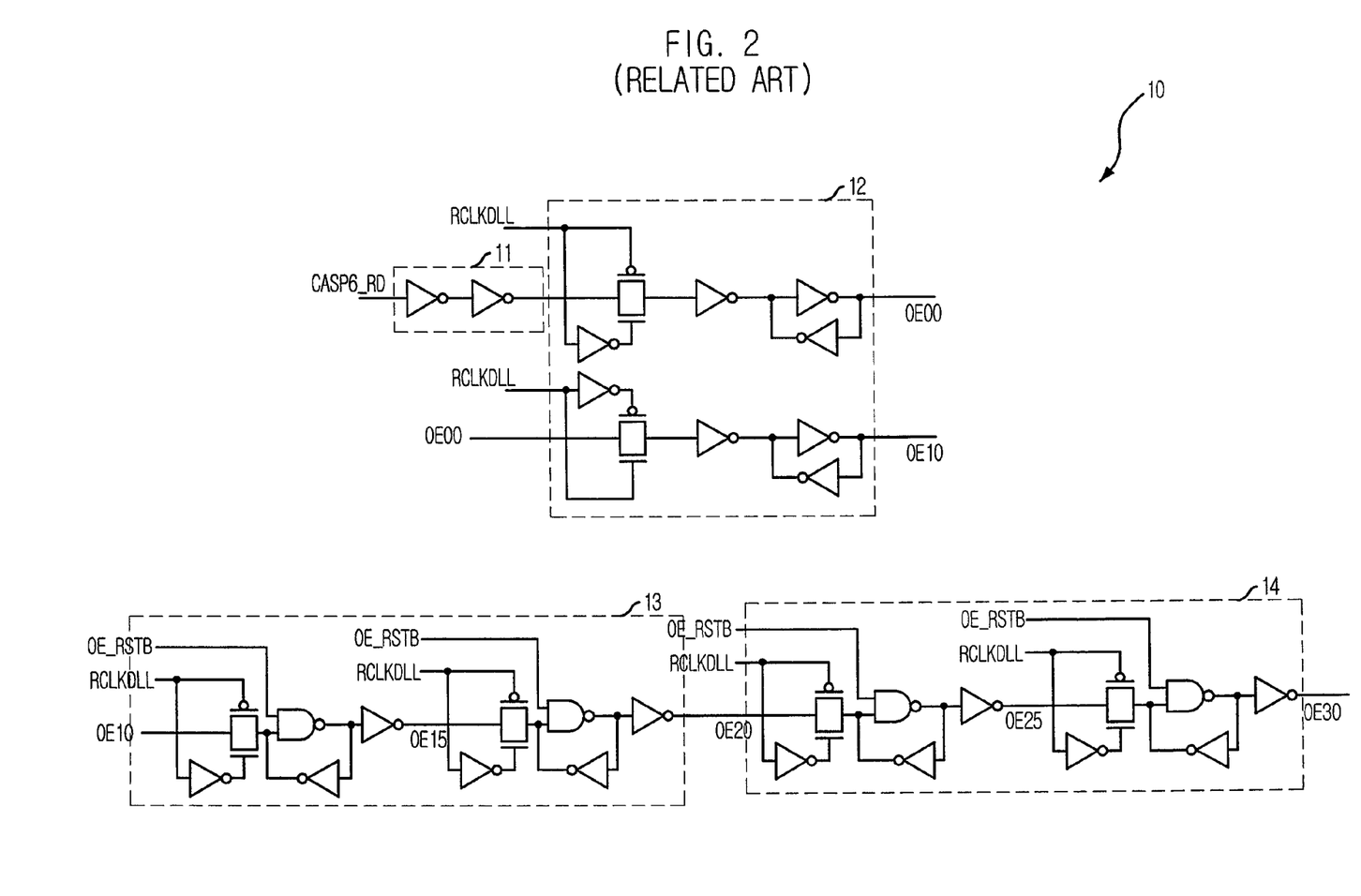
FIG. 2 is a block diagram of an output enable signal generator shown in FIG. 1.

FIG. 2 is a block diagram of the output enable signal generator 10 shown in FIG. 1.

The output enable signal generator 10 includes an inverter chain 11 and first to third shifter registers 12, 13 and 14. The inverter chain 11 delays and transfers the read CAS signal CASP6_RD. The first shift register 12 receives an output of the inverter chain 11 to output a first output enable signal OE00 in response to a rising DLL clock RCLKDLL and a second output enable signal OE10 by delaying the output signal of the inverter chain 11 by one clock. The second shift register 13 is initiated in response to an initial signal OE_RSTB and outputs a third output enable signal OE15 by delaying the second output enable signal OE10 by half clock and a fourth output enable signal OE20 by delaying the second output enable signal OE10 by one clock. The third shift register 14 is initiated in response to the initial signal OE_RSTB and outputs a fifth output enable signal OE25 by delaying the fourth output enable signal OE20 by half clock and a sixth output enable signal OE30 by delaying the fourth output enable signal OE20 by one clock.

Figure 3:
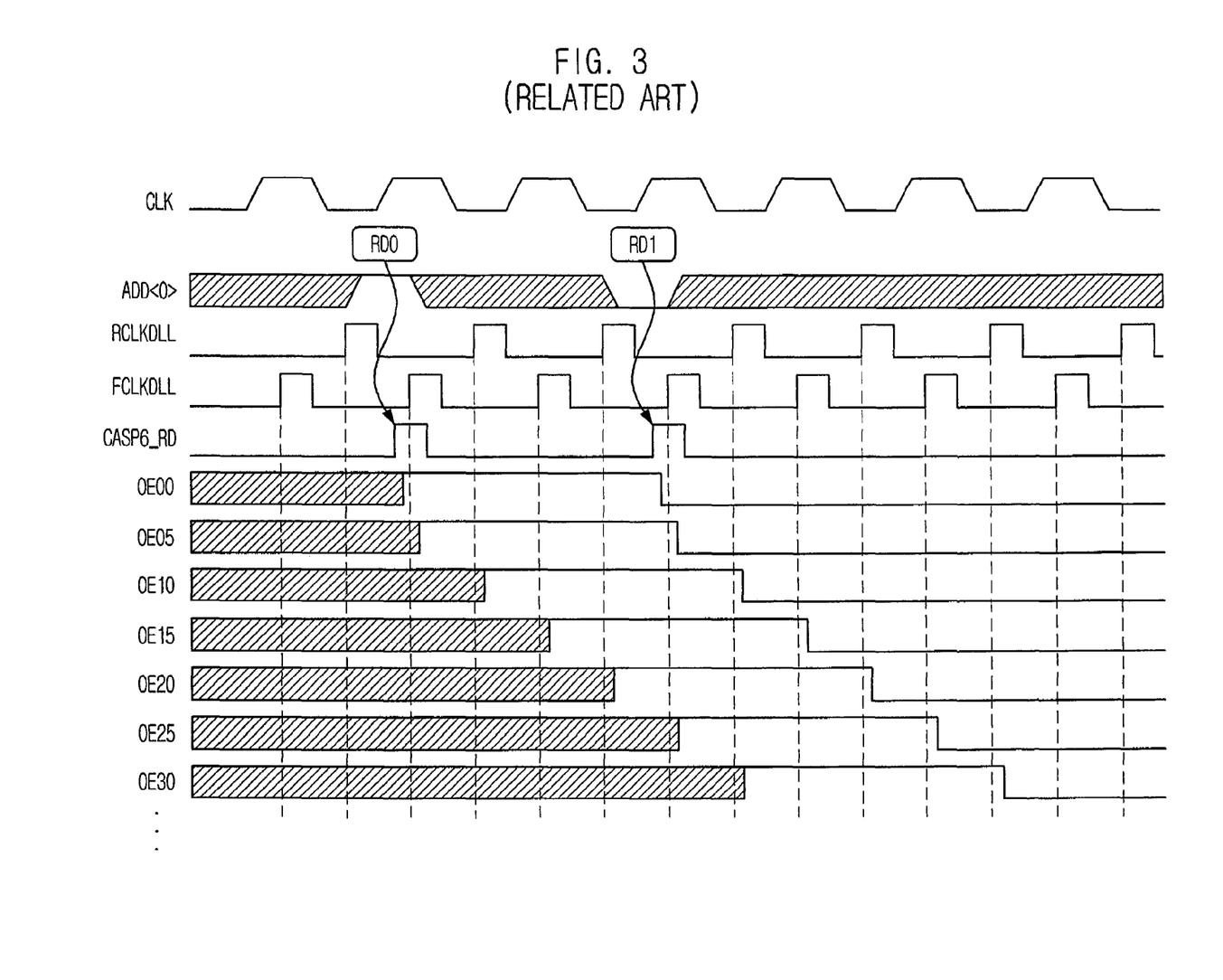
FIG. 3 is a waveform diagram illustrating an operation of the output enable signal generator shown in FIG. 2.

FIG. 3 is a waveform diagram illustrating an operation of the output enable signal generator 10 shown in FIG. 2.

The read CAS signal CASP6_RD is activated after a read command RD0 is applied. After the read CAS signal CASP6_RD is activated, the output enable signal generator 10 sequentially activates the first to sixth output enable signals OE00 to OE30 in units of half clock or one clock in response to the rising DLL clock RCLKDLL.

Hereinafter, referring to FIGS. 1 to 3, an operation of the conventional data output unit in the semiconductor memory device will be described.

First, if the read CAS signal CASP6_RD is activated after the read command RD0 is applied, the output enable signal generator 10 sequentially activates the first to sixth output enable signals OE00 to OE30 in units of half clock or one clock in response to the rising DLL clock RCLKDLL.

The output driving signal generator 20 outputs the rising and falling output driving signals ROUTEN and FOUTEN in response to activated ones among the CAS latency information signals CL1 to CL5.

As described above, when the rising and falling output driving signals ROUTEN and FOUTEN are generated, some of the output enable signals OE00 to OE30 may not be required.

Table 1 shows a corresponding one of the output enable signals, which is required according to the predetermined CAS latency.

TABLE 1

| CL(CAS Latency) | OE |
| --- | --- |
| 1 | OE00 |
| 2 | OE10 |
| 3 | OE20 |
| 4 | OE30 |
| 5 | OE40 |
| 6 | OE50 |

When the CAS latency is set to 1, the first output enable signal OE00 is only used. When the CAS latency is set to 2, the first and second output enable signals OE00 and OE10 are used. Likewise, when the CAS latency is set to 3, the first and third output enable signals OE00 and OE15 are required.

As described above, when the rising and falling output driving signals ROUTEN and FOUTEN are generated the number of required output enable signals differs according to the predetermined CAS latency.

However, the conventional data output unit always generates all of the output enable signals even if they are not all required. As a result, unnecessary current consumption is occurs.

SUMMARY OF THE INVENTION

It is, therefore, an object of the present invention to provide an output controller for reducing unnecessary current consumption.

In accordance with an aspect of the present invention, there is provided an output controller including: an output enable signal generator for generating corresponding ones among a plurality of output enable signals based on a preset column address strobe (CAS) latency, each of the output enable signals having information relating to a delay time from an activation timing of a CAS signal; and an output driving signal generator for receiving the plurality of output enable signals corresponding to the preset CAS latency and outputting rising and falling output driving signals for controlling an output timing of data.

In accordance with another aspect of the present invention, there is provided a semiconductor device for controlling data output timing, including: an initial synchronizing unit for outputting a first output enable signal by synchronizing a read CAS signal with a rising DLL clock; first to fifth synchronizing units, connected in series, each for receiving an output signal of the respective previous stage and outputting a corresponding output enable signal when a corresponding control signal is activated, wherein the first synchronizing unit receives the first output enable signal; a control unit for receiving the rising DLL clock and generating a plurality of control signals corresponding to a preset CAS latency; and an output driving signal generator for receiving the output enable signals activated in response to the rising DLL clock and outputting a rising driving signal in response to a corresponding CAS latency.

In accordance with further aspect of the present invention, there is provided an output controller, including: an interval signal generator for generating a plurality of interval signals activated at regular intervals from activating a flag signal, and a control signal generator for outputting a plurality of control signals based on the plurality of interval signals, wherein an interval signal corresponding to an activated selection signal among a plurality of selection signals is only activated.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

An output controller in accordance with exemplary embodiments of the present invention will be described in detail with reference to the accompanying drawings.

Figure 4:
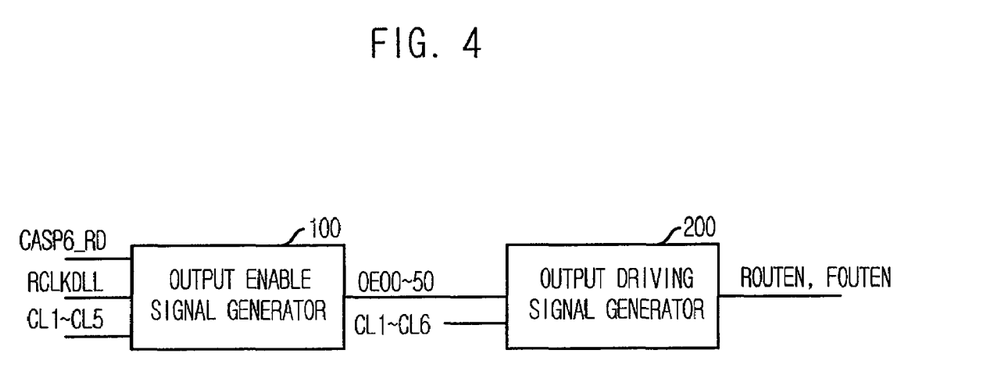
FIG. 4 is a block diagram of an output controller in accordance with an embodiment of the present invention.

FIG. 4 is a block diagram of an output controller in accordance with an embodiment of the present invention.

The output controller of the present invention includes an output enable signal generator 100 and an output driving signal generator 200. The output enable signal generator 100 generates corresponding ones among a plurality of output enable signals OE00 to OE50 having information relating to a delay time from an activation timing of a read column address strobe (CAS) signal CASP6_RD based on CAS latency information signals CL1 to CL5. The output driving signal generator 200 receives the plurality of output enable signals OE00 to OE50 and generates rising and falling output driving signals ROUTEN and FOUTEN in response to the CAS latency information signals CL1 to CL6.

Figure 5:
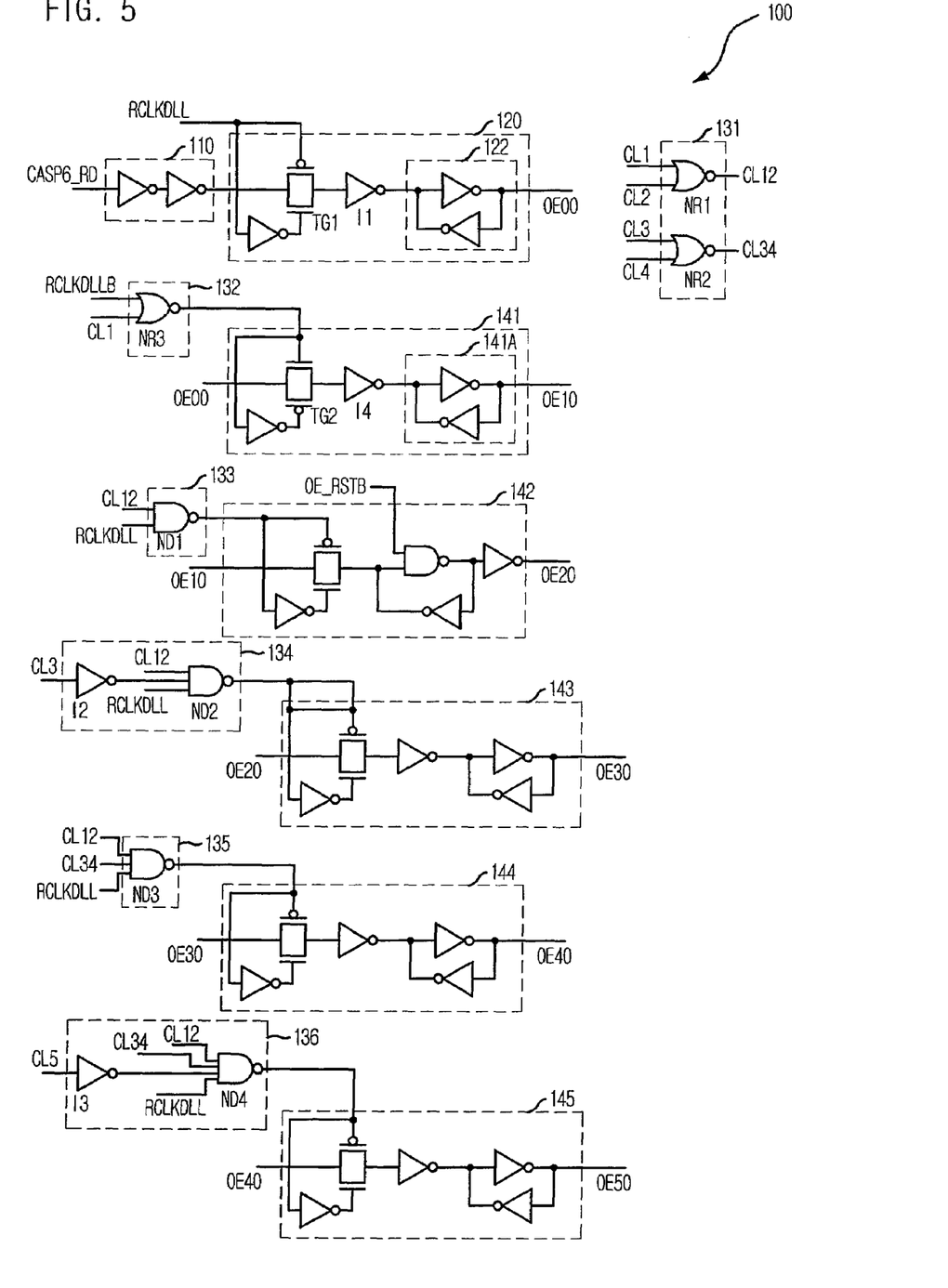
FIG. 5 is a detailed circuit diagram of an output enable signal generator shown in FIG. 4 in accordance with a first embodiment of the present invention.

FIG. 5 is a detailed circuit diagram of the output enable signal generator 100 shown in FIG. 4 in accordance with a first embodiment of the present invention. Particularly, FIG. 5 shows the output enable signal generator 100 which is operated in synchronization with a rising delay locked loop (DLL) clock RCLKDLL. The output enable signal generator 100 operated in synchronization with a falling DLL clock FCLKDLL is the same circuit structure shown in FIG. 5, except that the output enable signals are activated half clock later.

As shown, the output enable signal generator 100 includes an inverter chain 110, an initial synchronizing unit 120, a control unit 131 to 136, and first to fifth synchronizing units 141 to 145.

The inverter chain 110 delays and transfers the read CAS signal CASP6_RD to the initial synchronizing unit 120. The initial synchronizing unit 120 outputs a first output enable signal OE00 by synchronizing an output signal of the inverter chain 110 with the rising DLL clock RCLKDLL. The control unit 131 to 136 receives the rising DLL clock RCLKDLL and the CAS latency information signals CL1 to CL5, and generates first to fifth control signals. The first to fifth synchronizing units 141 to 145 connected in series receive output signals of the respective previous stages and output the output enable signals when a corresponding control signal output from the control unit 131 to 136 is activated.

In detail, the initial synchronizing unit 120 includes a first transfer gate TG1, a first inverter I1 and a first latch unit 122. The first transfer gate TG1 transfers an output of the inverter chain 110 in response to a logic level 'LOW' of the rising DLL clock RCLKDLL. The first inverter I1 inverts an output of the first transfer gate TG1. The first latch unit 122 latches an output of the first inverter I1 and outputs the latched signal as the first output enable signal OE00.

The control unit 131 to 136 includes an information expanding unit 131 and first to fifth control signal generating units 132 to 136. The information expanding unit 131 activates a first information expanding signal CL12 when the first and second CAS latency information signals CL1 and CL2 are inactivated, and activates a second information expanding signal CL34 when the third and fourth CAS latency information signals CL3 and CL4 are inactivated. The first control signal generating unit 132 outputs the rising DLL clock RCLKDLL as a first control signal when the first CAS latency information signal CL1 is inactivated. The second control signal generating unit 133 inverts the rising DLL clock RCLKDLL to output the inverted signal as a second control signal when the first information expanding signal CL12 is activated. The third control signal generating unit 134 inverts the rising DLL clock RCLKDLL to output the inverted signal as a third control signal when the first information expanding signal CL12 is activated and the third CAS latency information signal CL3 is inactivated. The fourth control signal generating unit 135 inverts the rising DLL clock RCLKDLL to output the inverted signal as a fourth control signal when the first and second information expanding signals CL12 and CL34 are activated. The fifth control signal generating unit 136 inverts the rising DLL clock RCLKDLL to output the inverted signal as a fifth control signal when the first and second information expanding signals CL12 and CL34 are activated and the fifth CAS latency information signal CL5 is inactivated.

In detail, the information expanding unit 131 includes a first NOR gate NR1 and a second NOR gate NR2. The first NOR gate NR1 receives the first and second CAS latency information signals CL1 and CL2 to output the first information expanding signal CL12. The second NOR gate NR2 receives the third and fourth CAS latency information signals CL3 and CL4 to output the second information expanding signal CL34.

The first control signal generating unit 132 includes a third NOR gate NR3 which receives an inverted rising DLL clock RCLKDLLB and the first CAS latency information signal CL1 to output the first control signal.

The second control signal generating unit 133 includes a first NAND gate ND1 which receives the rising DLL clock RCLKDLL and the first information expanding signal CL12 to output the second control signal.

The third control signal generating unit 134 includes a second inverter I2 and a second NAND gate ND2. The second inverter I2 inverts the third CAS latency information signal CL3. The second NAND gate ND2 receives an output of the second inverter I2, the rising DLL clock RCLKDLL and the first information expanding signal CL12 to output the third control signal.

The fourth control signal generating unit 135 includes a third NAND gate ND3 which receives the first and second information expanding signals CL12 and CL34 and the rising DLL clock RCLKDLL to output the fourth control signal.

The fifth control signal generating unit 136 includes a third inverter I3 and a fourth NAND gate ND4. The third inverter I3 inverts the fifth CAS latency information signal CL5. The fourth NAND gate ND4 receives an output of the third inverter I3, the rising DLL clock RCLKDLL and the first and second information expanding signals CL12 and CL34 to output the fifth control signal.

The first synchronizing unit 141 includes a second transfer gate TG2 and a fourth inverter I4 and a second latch unit 141A. The second transfer gate TG2 transfers the first output enable signal OE00 in response to a logic level 'HIGH' of the first control signal. The fourth inverter I4 inverts an output of the second transfer gate TG2. The second latch unit 144A latches an output of the fourth inverter I4 to output a second output enable signal OE10.

The second to fifth synchronizing units 142 to 145 have the same structures as that of the first synchronizing unit 141 except that they output third to sixth control signals in response to a logic level 'LOW' of each corresponding control signal.

For reference, if the CAS latency is set to 1, the first CAS latency information signal CL1 is activated with a logic level 'HIGH' and if the CAS latency is set to 2, the second CAS latency information signal CL2 is activated with a logic level 'HIGH'. Likewise, if the CAS latency is set to 3, the third CAS latency information signal CL3 is activated with a logic level 'HIGH'.

The first control signal is activated with a logic level 'HIGH' and the second to fifth control signals are activated with a logic level 'LOW'. In addition, the first and second information expanding signals CL12 and CL34 are activated with a logic level 'HIGH'.

Hereinafter, an operation of the output enable signal generator 100 will be described in detail.

First, if the CAS latency is set to 1, the first CAS latency information signal CL1 is activated with a logic level 'HIGH' and the second to fifth CAS latency information signals CL2 to CL5 are inactivated with a logic level 'LOW'.

The information expanding unit 131 inactivates the first information expanding signal CL12 with a logic level 'LOW' and activates the second information expanding signal CL34 with a logic level 'HIGH'.

The first control signal generating unit 132 outputs the first control signal with a logic level 'LOW' in response to the logic level 'HIGH' of the first CAS latency information signal CL1. Each of the second to fifth control signal generating units 133 to 136 outputs the second to fifth control signals with a logic level 'HIGH' in response to the logic level 'LOW' of the first information expanding signal CL12.

If the read CAS signal CASP6_RD is activated after the read command is applied, the initial synchronizing unit 120 outputs the first output enable signal OE00 in response to a logic level 'LOW' of the rising DLL clock RCLKDLL. The first to fifth synchronizing units 141 to 145 are turned-off in response to the first to fifth control signals.

Accordingly, when the read CAS signal CASP6_RD is activated, the first output enable signal OE00 is only activated in response to the rising DLL clock RCLKDLL. The second to sixth output enable signals OE10 to OE50 are not activated.

Next, if the CAS latency is set to 3, the third CAS latency information signal CL3 is activated with a logic level 'HIGH' and the other CAS latency information signals CL1, CL2, CL4 and CL5 are inactivated with a logic level 'LOW'.

The information expanding unit 131 inactivates the first information expanding signal CL12 with a logic level 'HIGH' and activates the second information expanding signal CL34 with a logic level 'LOW'.

The first control signal generating unit 132 outputs the first control signal by inverting the inverted rising DLL clock RCLKDLLB in response to the logic level 'LOW' of the first CAS latency information signal CL1. The second control signal generating unit 133 outputs the second control signal by inverting the rising DLL clock RCLKDLL in response to the logic level 'HIGH' of the information expanding signal CL12. Each of the third to fifth control signal generating units 134 to 136 outputs the corresponding control signal with a logic level 'HIGH' in response to the logic level 'HIGH' of the third CAS latency information signal CL3 and the logic level 'LOW' of the second information expanding signal CL34.

If the read CAS signal CASP6_RD is activated after the read command is applied, the initial synchronizing unit 120 outputs the first output enable signal OE00 in response to a logic level 'LOW' of the rising DLL clock RCLKDLL. The first and second synchronizing units 141 and 142 output the second and third output enable signals OE10 and OE20 in response to the first and second control signals. The third and fifth synchronizing units 143 and 146 are turned-off in response to the third and fifth control signals.

Accordingly, after the read CAS signal CASP6_RD is activated, the first to third output enable signals OE00 to OE20 are sequentially activated in synchronization with the rising DLL clock RCLKDLL.

As described above, the output enable signal generator 100 in accordance with the first embodiment of the claimed invention further includes the control unit 131 to 136 receiving the CAS latency information signals CL1 to CL5. As a result, each transfer gate provided in the synchronizing units is turned off according to the control signals output from the control unit 131 to 136. Accordingly, it is possible to reduce unnecessary current consumption by turning off the synchronizing units which generates unnecessary output enable signals.

Figure 6:
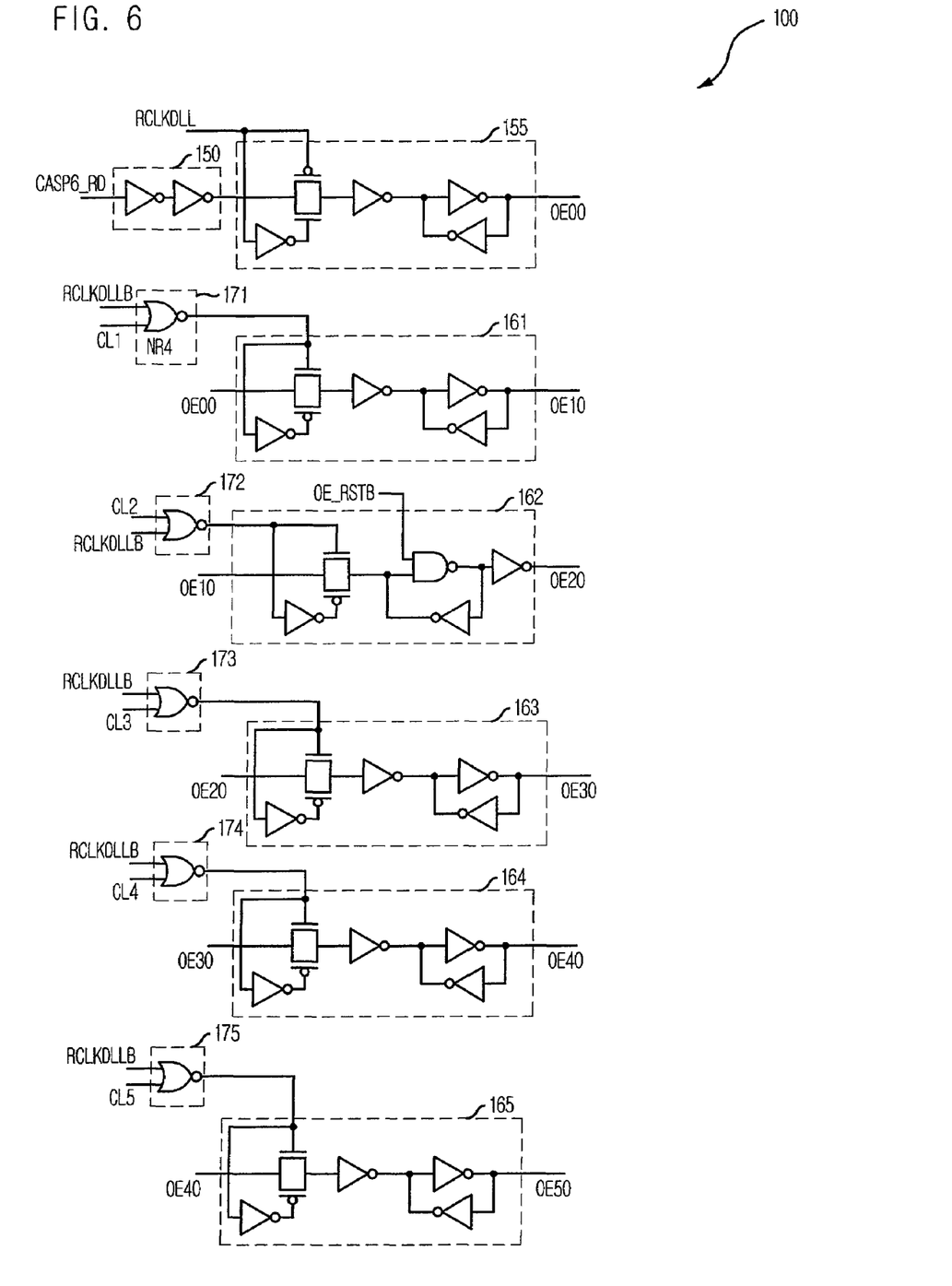
FIG. 6 is a detailed circuit diagram of an output enable signal generator shown in FIG. 4 in accordance with a second embodiment of the present invention.

FIG. 6 is a circuit diagram of the output enable signal generator 100 shown in FIG. 4 in accordance with a second embodiment of the present invention.

The output enable signal generator 100 in accordance with the second embodiment of the present invention includes an inverter chain 150, an initial synchronizing unit 155, a control unit 171 to 175, and first to fifth synchronizing units 161 to 165.

The inverter chain 150 delays and transfers the read CAS signal CASP6_RD to the initial synchronizing unit 155. The initial synchronizing unit 155 outputs a first output enable signal OE00 by synchronizing an output signal of the inverter chain 150 with the rising DLL clock RCLKDLL. The control unit 171 to 175 receives an inverted rising DLL clock RCLKDLLB and the CAS latency information signals CL1 to CL5, and generates first to fifth control signals. The first to fifth synchronizing units 161 to 165 connected in series receive output signals of the respective previous stages and output the output enable signals OE10 to OE50 when a corresponding control signal output from the control unit 171 to 175 is activated.

In detail, the control unit includes first to fifth control signal generating units 171 to 175. Each of the first to fifth control signal generating units 171 to 175 outputs the rising DLL clock RCLKDLL as the first to fifth control signals when a corresponding one of the CAS latency information signals CL1 to CL5 is inactivated.

The second to fifth control signal generating units 172 to 175 have the same structures as that of the first control signal generating unit 171 except for the CAS latency information signal. The first control signal generating unit 171 is described as an exemplary structure.

The first control signal generating unit 171 includes a first NOR gate NR4 which receives the inverted rising DLL clock RCLKDLLB and a first CAS latency information signal CL1 to output the first control signal.

If the CAS latency is set to 3, a third CAS latency information signal CL3 is activated with a logic level 'HIGH' and the other CAS latency information signals CL1, CL2, CL4 and CL5 are inactivated with a logic level 'LOW'.

The third control signal generating unit 173 outputs the third control signal with a logic level 'LOW'. Each of the other control signal generating units 171, 172, 174 and 175 outputs the corresponding control signal by inverting the inverted rising DLL clock RCLKDLLB.

If the read CAS signal CASP6_RD is activated after the read command is applied, the initial synchronizing unit 155 outputs the first output enable signal OE00 in response to a logic level 'LOW' of the rising DLL clock RCLKDLL. The first and second synchronizing units 161 and 162 sequentially output the second and third output enable signals OE10 and OE20 in units of one clock. At this time, the third synchronizing unit 163 is turned off in response to the third control signal. Accordingly, though the fourth and fifth synchronizing units 164 and 165 are turned on, they do not output and activate a corresponding control signal.

As described above, the output enable signal generator 100 in accordance with the second embodiment of the claimed invention further includes the control unit 171 to 175 which receives the CAS latency information signals CL1 to CL5 and controls the synchronizing units 161 and 165 for generating the output enable signals by synchronizing the read CAS signal CASP6_RD with the rising DLL clock RCLKDLL. That is, after the required output enable signal is activated, the next synchronizing unit is only turned off in response to the preset CAS latency. As a result, the other synchronizing units which receive an output of the turned off synchronizing unit do not activate the output enable signals. For example, if the CAS latency is set 2, the second synchronizing unit 162 is turned off so that the required output enable signals, i.e., the first and second output enable signals OE00 and OE10, are only activated. Likewise, if the CAS latency is set 4, the fourth synchronizing unit 164 is turned off so that the required output enable signals, i.e., the first to fourth output enable signals OE00 to OE30, are only activated.

The output enable signal generator 100 in accordance with the second embodiment of the claimed invention may consume unnecessary current greater than that of the first embodiment because the next synchronizing unit is only turned off after the required output enable signal is activated.

Figure 7:
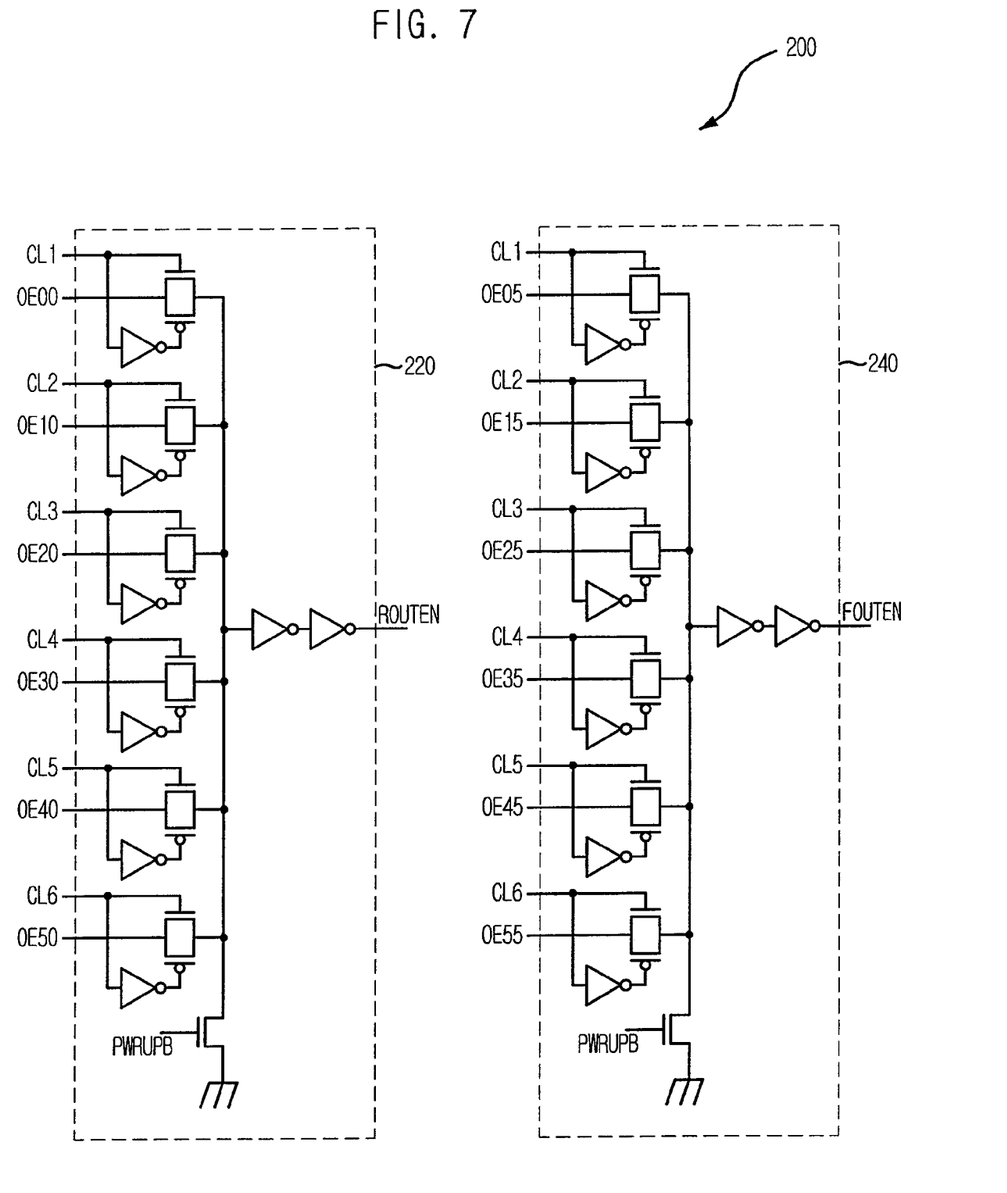
FIG. 7 is a circuit diagram of an output driving signal generator shown in FIG. 4.

FIG. 7 is a circuit diagram of the output driving signal generator 200 shown in FIG. 4.

The output driving signal generator 200 includes a first output driving signal generator 220 and a second output driving signal generator 240. The first output driving signal generator 220 receives corresponding output enable signals OE00 to OE50 to output the rising output driving signal ROUTEN in response to a corresponding signal among the first to sixth CAS latency information signals CL1 to CL6. The second output driving signal generator 240 receives corresponding output enable signals OE05 to OE55 to output the falling output driving signal FOUTEN in response to a corresponding signal among the first to sixth CAS latency information signals CL1 to CL6.

The first and second output driving signal generators 220 and 240 include a plurality of transfer gates and a latch unit. Each of transfer gates receives the output enable signal and transfers the received signal in response to a corresponding. CAS latency information signal. The latch unit latches a signal at an output common node of the transfer gates to output the latched signal as the rising output driving signal ROUTEN or falling output driving signal FOUTEN.

The output enable signals OE00 to OE50 input to the first output driving signal generator 220 are activated in response to the rising DLL clock RCLKDLL, and the output enable signals OE05 to OE55 input to the second output driving signal generator 240 are activated in response to the falling DLL clock FCLKDLL.

Hereinafter, referring to FIGS. 4 to 7, the output controller of the present invention is described.

The output enable signal generator 100 selectively activates the required output enable signal in response to the preset CAS latency. The output driving signal generator 200 receives the output enable signals and outputs the rising output driving signal ROUTEN and the falling output driving signal FOUTEN based on the CAS latency information signals.

As described above, when the output enable signals are generated, the output controller of the claimed invention receives the CAS latency information signals so as to generate the required output enable signal corresponding to the CAS latency information signals. As a result, it is possible to reduce unnecessary current consumption by preventing unnecessary output enable signals from being generated when the output driving signals are generated by the preset CAS latency.

While the present invention has been described with respect to the output controller for controlling a data output timing by the read command, it is possible to apply the present invention to a block which activates a plurality of signals at regular intervals based on a flag signal such as the read CAS signal and generates a control signal corresponding to a selection signal. That is, when the plurality of signals are generated at regular intervals from the flag signal, it is possible to reduce unnecessary current consumption by generating the control signal based on the selection signal.

The present application contains a subject matter related to Korean patent application Nos. 2005-91570 & 2005-130483, filed in the Korean Intellectual Property Office on Sep. 29, 2005 & Dec. 27, 2005, respectively, the entire contents of which are incorporated herein by reference.

While the present invention has been described with respect to certain preferred embodiments, it will be apparent to those skilled in the art that various changes and modifications may be made without departing from the scope of the invention as defined in the following claims.

What is claimed is:

1. An output controller, comprising:
   an interval signal generator for generating a plurality of interval signals activated at regular intervals upon activation of a flag signal, and
   a control signal generator for outputting a plurality of control signals based on the plurality of interval signals,
   wherein only an interval signal corresponding to an activated selection signal among a plurality of selection signals is activated.

2. The output controller as recited in claim 1, wherein the interval signal generator includes:
   a plurality of shifting units, connected in series, each for outputting the plurality of interval signals by synchronizing an output signal of the respective previous stage with a clock, wherein a first shifting unit receives the flag signal; and
   a controlling unit for applying the clock to the shifting units for generating one interval signal corresponding to the activated selection signal among the plurality of interval signals.

3. The output controller as recited in claim 2, wherein the controlling unit includes a plurality of control signal generators, each for receiving the clock and a corresponding one of the selection signals to apply the clock when the corresponding selection signal is activated.

4. The output controller as recited in claim 3, wherein each of the control signal generators includes a NOR gate.

* * * * *